United States Patent [19]

Asrar

[11] Patent Number: 5,424,009
[45] Date of Patent: Jun. 13, 1995

[54] CATALYTIC, CROSSLINKED POLYMERIC FILMS FOR ELECTROLESS DEPOSITION OF METAL

[75] Inventor: Jawed Asrar, Chesterfield, Mo.

[73] Assignee: Monsanto Company, St. Louis, Mo.

[21] Appl. No.: 248,271

[22] Filed: May 24, 1994

[51] Int. Cl.⁶ .................. C09D 5/24; C09D 5/38
[52] U.S. Cl. ...................... 252/513; 252/514; 106/1.21; 106/157.1; 524/100; 524/191
[58] Field of Search .............. 106/1.21, 197.1; 252/513, 514; 524/100, 191

[56] References Cited

U.S. PATENT DOCUMENTS

| | | | |
|---|---|---|---|
| 3,615,471 | 10/1971 | Lenoble et al. | 96/38.3 |
| 3,719,490 | 3/1973 | Yudelson et al. | 96/48 PD |
| 4,910,072 | 3/1990 | Morgan et al. | 428/212 |
| 5,082,734 | 1/1992 | Vaughn et al. | 428/411.1 |
| 5,338,708 | 8/1994 | Felten | 106/1.21 |

*Primary Examiner*—David Brunsman
*Attorney, Agent, or Firm*—Thomas E. Kelley

[57] ABSTRACT

Catalytically inert, crosslinked polymeric films adapted to be activated to catalyze electroless deposition of metal by application of heat are formed from solutions of hydroxy-functionalized polymer, preferred polymers include hydroxy-reactive crosslinking agent and a Group 8 metal compound. Preferred crosslinking agents are block isocyanates and methylated melamines.

6 Claims, No Drawings

CATALYTIC, CROSSLINKED POLYMERIC FILMS FOR ELECTROLESS DEPOSITION OF METAL

Disclosed herein are catalytic, crosslinked polymeric films for electroless deposition of metal onto articles, solutions for preparing catalytically-inert precursors of such films and methods of preparing inert and catalytic films.

BACKGROUND OF THE INVENTION

Electroless deposition of metal is effected by immersing catalyzed substrates into metal solutions, e.g. of soluble nickel, cobalt or copper, a reducing agent and a chelant. Although substrates can be catalyzed with a variety of metals from Group 1B or Group 8, palladium, despite its cost, is often the catalyst of choice due to its activity. Maintaining adhesion of the catalyst to the surface is of considerable importance since loosely adhered catalytic metal can be washed from the surface in the agitation of the plating bath causing depletion of the metal value of the plating bath as uncontrolled metal deposition occurs, resulting in what is commonly referred to as a "crashed" bath.

Adhesion of catalytic metal can be promoted by incorporating the metal in a polymeric film. For instance, Morgan et al. in U.S. Pat. No. 4,910,072 discloses selective catalytic activation of catalytically inert polymeric films comprising complexes of a polymer and a compound of a Group 1B or 8 metal where the films are prepared from preferably anhydrous solutions.

Vaughn in U.S. Pat. No. 5,082,734 discloses the use of aqueous coating systems to selectively provide catalytic polymeric surfaces. In many cases the polymeric coating is sufficiently resistant to the solubilizing components of aqueous plating solutions, e.g. acid, base or formaldehyde, to allow plating of a adequately adhesive metal layer. In other cases the catalytic activity is so high that an occluding layer of metal is deposited before the aqueous plating bath can adversely affect the catalytic layer. However, in certain other cases, e.g. where the polymer contains hydrophilic groups and/or low levels of catalytic metal, immersion in an aqueous plating bath promotes a variety of undesirable effects, e.g. dissolution of catalytic metal, swelling or solubilization of the polymer coating with loss of catalytic metal, weakened adhesion between the substrate and catalytic polymer layers or weakened adhesion between the metal and catalytic polymer layers.

Prior art practitioners have disclosed the use of a variety of crosslinking agents to minimize any tendency for hydroxy-containing polymers such as polyvinyl alcohol (PVOH) and cellulosic polymers to solubilize and be washed away. For instance, Vaughn in U.S. Pat. No. 5,082,734 discloses the use of terephthaldicarboxaldehyde, glutaraldehyde or dialdehyde starch as crosslinking agents. Lenoble in U.S. Pat. No. 3,615,471 discloses electroless deposition on catalytic polymeric photoresistant coatings from aqueous solutions of palladium dichloride, PVOH and a light activated crosslinker such as potassium bichromate. Yudelson et al. in U.S. Pat. No. 3,719,490 disclose electroless deposition on catalytic coatings from solutions of actinic light activated palladium, a polymeric binder such as gelatin or PVOH with a boric acid crosslinker. Such crosslinking agents provide marginal improvement against the adverse effects of electroless plating baths.

SUMMARY OF THE INVENTION

I have discovered that metal coatings having enhanced adhesion can be electrolessly deposited onto articles coated with films of hydroxy-functionalized polymers crosslinked with a polyfunctional, hydroxy-reactive crosslinking compound. Catalytically inert, precursor films can be prepared from solutions comprising (a) hydroxy-functionalized polymer, e.g. a cellulosic polymer or a vinyl alcohol-containing polymer, (b) a hydroxy-reactive, polyfunctional crosslinking compound and (c) a catalytic metal of Group 8. Catalytically-inert films comprising crosslinked polymer and Group 8 metal can be made catalytic to electroless deposition by thermal activation, e.g. by exposing the inert film to heat or heat generating radiation.

DETAILED DESCRIPTION OF THE INVENTION

Throughout this specification, percentages of compositions are by weight and temperatures are in degrees Celsius, unless indicated otherwise.

The term "catalytic metal" as used herein refers to metals of Group 8 of the Periodic Table of Elements, i.e. iron, cobalt, nickel, ruthenium, rhodium, palladium, iridium, osmium and platinum. Preferred Group 8 metals are ruthenium, rhodium, palladium, iridium and platinum. The most preferred metal used in preparing films according to this invention is palladium. Such catalytic metals are desirably employed as water or alcohol soluble compound, e.g. salts or complexes with ligands such as acetonitrile, acetone, acetate, chloride, nitrate, The term "hydrophilic solution" as used herein refers to water or water soluble organic solvent solutions of dissolved or dispersed catalytic metal, polymer and crosslinking agent. Preferred solvents include water, lower alkyl alcohols such methanol, ethanol, propanol, butanol, pentanol, and isomers thereof and glycols such as ethylene glycol, glycol esters such as ethylene glycol monethyl ester, ethylene glycol monopropyl ester or ethylene glycol monobutyl ester, ketones such as acetone and methyl ethyl ketone tetrahydrofuran and mixtures thereof.

Hydroxy-functionalized polymers of this invention comprise cellulosic polymers and vinyl alcohol-containing polymers. Preferred cellulosic polymers include methyl cellulose and hydroxypropyl methylcellulose. Preferred vinyl alcohol-containing polymers include polyvinylalcohol (PVOH) and polyvinyl acetals such as polyvinylformal and polyvinylbutyral. Polyvinyl acetals are commercially available from Monsanto Company as Formvar® polyvinyl formal and Butvar® polyvinyl butyral. Polyvinyl acetals are prepared by reacting an aldehyde with PVOH which, when prepared by hydrolysis of polyvinyl acetate, will typically contain both hydroxyl and acetate groups. Consequently, polyvinyl acetals typically contain a preponderance of vinyl acetal groups, a lower amount of vinyl alcohol groups and a minor amount of vinyl ester groups. For instance, certain polyvinyl butyrals are characterized as terpolymer of about 80 mole percent vinyl butyral units, about 18 to 20 mole percent vinyl alcohol units and up to about 2.5 mole percent vinyl ester, e.g. vinyl acetate, units. To minimize the solubilizing effect of subsequent treatment in plating baths, it is often preferred that the polymer be of a high molecular weight, e.g. greater than 50,000 Daltons.

Preferred polyfunctional crosslinking compounds include block isocyanate compounds and methylated melamine compounds. Block isocyanate compounds, commercially available from Miles, Inc., can react with hydroxyl groups of the polymer in a urethane linkage. Methylated melamine compounds, commercially available from Monsanto Company under the Resimene trademark, can react with hydroxyl units in an ether linkage. Methylated melamine compounds are prepared by reacting melamine with up to six molar equivalents of formaldehyde producing methylol groups which can be reacted with alcohol, e.g. methanol, butanol and the like, to produce alkyl ether groups. Crosslinking reactions between hydroxy-functionalized polymer and methylated melamine can be effected by application of heat and/or an acid catalyst, e.g. p-toluene sulfonic acid or hydrochloric acid. Useful crosslinking agents include Resimene ® AQ-7550 methylated melamine resin typically having two methyl ether groups and one methylol group, Resimene ® 747 methylated melamine resin typically having five methyl ether groups and one methylol group; and Resimene ® 755 methylated melamine resin typically having three methyl ether groups, two butyl ether groups and one methylol group.

The term "Copper Bath" as used herein refers to an agitated electroless plating solution comprising about 8 g/l formalin, about 4 g/l copper, and about 0.12 M ethylenediaminetetraacetic acid and which is maintained at pH 11.5–12.5 and about 35° C.

The term "Nickel Bath" as used in the following examples refers to an agitated electroless nickel plating bath similar to one available from MacDermid, Inc. identified as XD7054EN comprising 6 g/l nickel and 30 g/l sodium hypophosphite monohydrate adjusted to pH 6.5 with ammonium hydroxide solution and maintained at about 60° C.

The term "catalytically inert" as used herein refers to films of polymer and catalytic metal compounds having surfaces onto which metal is not effectively deposited from standard electroless plating solutions such as a Copper Bath.

The term "catalytically activatable" as used herein refers to catalytically inert films, e.g. comprising crosslinked polymer and catalytic metal compound, which can be made catalytic, e.g. receptive to effective, adhesive deposition of metal such as copper or nickel from a standard electroless plating bath, by exposing selected areas of the catalytically inert film to heat or heat generating radiant energy. For instance, heat can be provided to the polymer film by exposing selected areas to heat transfer fluid, e.g. hot air, or coherent electromagnetic radiation such as from a laser, electron beam radiation, etc., which can be adsorbed generating sufficient heat to allow activation.

The metal coated articles of this invention comprise a layer of electrolessly deposited metal on a catalytic layer of crosslinked polymer and Group 8 metal. Such metal coated articles can comprise molded articles where the metal layer provides shielding against electromagnetic radiation, e.g. for electronic equipment housings, or environmental resistance, e.g. for automotive trim or fixtures. Other metal coated articles can comprise printed circuits or patterns on rigid polymeric substrates or on flexible polymeric films. Still other articles can comprise metal coated textile materials, e.g. woven, non-woven, knitted or needle-punched fabrics, threads, yarns, chopped fiber, sliver or monofilament tow and the like. The substrate of the metal coated articles can comprise any of a variety of materials including inorganic materials such as metals, metal oxides, stone, ceramics, glass, quartz, alumina, carbon and graphite; organic polymers including organic thermoset polymers such as epoxy and phenolic resins and thermoplastic polymers such as polyamides, polyaramides, polyesters, polyolefins, polycarbonates, polysulfones, styrenics, and cellulosics; and natural materials such as wood. In the case of textile materials the substrate can comprise natural fibers such as cellulosics, synthetic fibers of acrylic, nylon, polyester, polyaramide, inorganic fibers such as glass, quartz, graphite and the like.

Metal coatings on the articles of this invention can comprise any of a variety of the metals, e.g. copper, nickel, cobalt, silver, and the like, which can be deposited electrolessly from aqueous solutions onto palladium catalyzed surfaces. A variety of electroless plating solutions are commercially available from suppliers such as Shipley, Inc., MacDermid, Inc. and Atotech Inc. Still many other electroless plating baths are published in the literature. In many cases it is desirable to provide the metal-coated article with a multilayered metal coating, e.g. a first electrolessly deposited layer of copper, nickel or cobalt and one or more subsequent layers applied electrolessly, electrolytically or by replacement, e.g. in the case of silver.

The choice of solvent and polymer will typically be influenced by the compatability with the substrate, e.g. to promote optimal adhesion of the crosslinked polymer to the substrate. In this regard, the films of this invention are formed from hydrophobic or hydrophilic solutions of the above described polymers, crosslinking agents and catalytic metal compound; hydrophilic solutions are generally preferred for substrates having at least a modest degree of surface energy, e.g. polyesters, polyamides, polyimides and the like. Useful solutions comprise as little as 0.1 percent and up to about 10 percent polymer. Lesser or greater amounts of polymer can be used depending on the film forming character of the polymer and the desired thickness of the film. Especially useful film forming solutions contain between 1 and 5 percent polymer. The amount of crosslinking agent used in the film-forming solution will typically depend on the amount of hydroxy group functionality of the polymer, the polyfunctional nature of the crosslinking agent and the degree of crosslinking desired. Many commonly useful solutions will contain in the range of 0.1 to 10 percent crosslinking agent, e.g. typically about 0.2 to 5 percent. The catalytically inert films of this invention are provided by employing a higher proportion by weight of polymer than catalytic metal, e.g. in a weight ratio of polymer to catalytic metal of at least 2:1, say about 3:1 or higher, up to about 9:1. In some cases it may be desirable to provide a film in a weight ratio of polymer to catalytic metal of at least 15:1 or 20:1, even up to 30:1 or more. Thus, film-forming solutions useful in this invention will typically comprise about 0.1 to 5 percent palladium, provided as a soluble salt of an acetate, chloride, nitrate, or other anionic ligand.

The choice of method for applying the solution to provide a catalytically inert film depends on the nature of the substrate and the metallized layer desired. For instance in the case of textile materials such fibers, yarns, woven and nonwoven fabrics, catalytically inert films can be provided by dipping the textile substrate into the solution and letting the solution drip off or passing the textile through rolls to remove excess solution. The solvents can be evaporated by letting the wet coated substrate stand in air or be facilitated by warm air passing through the textile material. In the case of flexible or rigid films, the solution can be applied by roller, doctor blade, spray and such to provide large area coverage of a wet film which can be dried to a catalytically inert film by allowing the water to evaporate. Fine patterns can be applied to film substrates by printing techniques, e.g. intaglio, rotogravure, flexographic, screen or ink jet printing onto a moving web of the substrate. Methods for coating other types of substrates, e.g. foams, elastomers, housings, containers, etc., will be readily apparent to those skilled in the art of coatings. Depending on the composition of the substrate those skilled in the art can readily prepare solutions with an appropriately polymer that will be sufficiently compatible with the substrate to allow the desired adhesion of the catalytically inert film to the substrate. The following description of preparing catalytically inert films on common substrates, e.g. films and fibers, is not intended as a limitation but an illustration of the ease in which the solutions of this invention can be applied to unique substrates. The application of this invention to other substrates should be readily apparent.

Moreover, it has been observed that drying is an important step in the practice of this invention regardless of the nature of the substrate. Evaporation can be advantageously facilitated by exposing the wet film to moderate evaporation conditions, e.g. moderate vacuum or moderate warm air flow, either of which provides an environment having a partial pressure of solvent low enough to expedite evaporation but is desirably not so low as to cause boiling of solvent from the film surface. Such dried films are typically catalytically inert or exhibit such poor catalytic properties, that thermal activation, e.g. by heating in the range of about 100° C. to 300° C., depending for instance on the nature of the substrate and polymer, degree of crosslinking and relative amount of catalytic metal. Generally, longer exposure times are required for lower temperatures. For instance, 3 to 5 seconds may be adequate for 250° C. exposure while 60 seconds may be appropriate for 100° C. exposure. It is believed that thermal activation provides a large number of uniformly-distributed, small clusters of catalytic metal complex, which can be reduced to provide a polymer surface with a large number of uniformly-distributed, small clusters of catalytic metal, e.g. catalytic metal clusters of about 10 Angstrom nominal diameter. An advantage of the films of this invention is that after such thermal activation, the exposed surface of the film will be catalytically active to the electroless deposition of metal, e.g. from a Copper Bath or Nickel Bath.

The following examples serve to illustrate certain embodiments and aspects of this invention but are not intended to imply any limitation of the scope of the invention.

EXAMPLE 1

This example illustrates a solution and film of this invention providing high adhesion to substrates in electroless plating solutions. A 25 micrometer thick wet film of an aqueous catalyst solution comprising hydroxypropyl methylcellulose (HPMC), palladium and methylated melamine crosslinking agent in the weight ratio of 8/16/1 was cast onto a polyethylene terephthalate (PET) film, dried at 25° C. to and heated at 175° C. to activate a catalytic, crosslinked HPMC polymeric surface. The stability of the catalytic, crosslinked HPMC coating was evaluated by immersing the coated PET film for 10 minutes in a 2% solution of sodium hydroxide/formaldehyde, common ingredients of some electroless plating solutions. The coated PET film was then immersed in a Copper Bath providing a shiny layer of electrolessly deposited copper on the film.

COMPARATIVE EXAMPLE 1

The procedure of Example 1 was essentially repeated except that the aqueous solution did not contain crosslinking agent. Immersion in the caustic formaldehyde solution caused significant amounts of the activated HPMC polymer film to be washed off of the PET substrate so that copper was not deposited on the film.

COMPARATIVE EXAMPLE 2

This example illustrates the adverse effect on electroless deposition using crosslinked catalytic films prepared according to prior art practices, e.g. Example 7 of U.S. Pat. No. 3,719,490. A film forming solution was prepared by combining 10 g of 5 percent aqueous solution of polyvinyl alcohol (2,000 M.W., 75 mole percent hydrolyzed), 10 ml of the 0.5 percent solution of palladium tetraamine chloride and 1 ml of 1 percent solution of boric acid. Wet films (25 microns and 250 microns thick) of the film forming solution were cast onto PET sheets and dried in room temperature air. Films exposed for 15 minutes at about 25 cm to a 450 watt mercury lamp were immersed in a Copper Bath or a Nickel Bath for about 4 minutes; no metal was deposited on any of the films. Films were heated in 160° C. air for 10 minutes and immersed a in Copper Bath or a Nickel Baths for about 4 minutes; blistered (i.e. non-adhering) metal was deposited on the films.

While specific embodiments have been described, it should be apparent to those skilled in the art that various modifications thereof can be made without departing from the true spirit and scope of the invention. Accordingly, it is intended that the following claims cover all such modifications within the full inventive concept.

What is claimed is:

1. A catalytically inert film comprising a hydroxy-functionalized polymer crosslinked with a polyfunctional hydroxy-reactive crosslinking compound selected from the group consisting of block isocyanate compounds and methylated melamine compounds and metal of Group 8; wherein said film can be selectively activated to catalyze electroless deposition by application of heat.

2. A film according to claim 1 wherein said hydroxy-functionalized polymer is a cellulose-derivative polymer or vinyl alcohol-containing polymer.

3. A film according to claim 1 wherein said hydroxy-functionalized polymer is selected from the group consisting of hydroxypropyl methylcellulose, polyvinyl alcohol, polyvinyl formal and polyvinyl butyral; wherein said polyfunctional hydroxy-reactive crosslinking compound is a methylated melamine compound; and wherein said Group 8 metal is palladium.

4. A catalyst solution for forming catalytically inert films which can be selectively activated to catalyze electroless deposition of metal comprising (a) hydroxy-functionalized polymer, (b) Group 8 metal compound and (c) hydroxy-reactive, polyfunctional crosslinking compound selected from the group consisting of block isocyanate compounds and methylated melamine compounds; wherein said polymer and Group 8 metal are in proportions such that the solution is adapted to forming catalytically inert, crosslinked films which can be heated to become catalytic for electroless deposition of bright copper from an agitated solution comprising about 8 grams/liter formaldehyde, about 4 grams/liter copper, and about 0.12 M ethylenediaminetetraacetic acid and which is maintained at pH 11.5–12.5 and about 35° C.

5. A solution according to claim 4 wherein said hydroxy-functionalized polymer is a cellulose-derivative polymer or vinyl alcohol-containing polymer.

6. A solution according to claim 4 comprising 1 to 10 weight percent of hydroxy-functionalized polymer selected from the group consisting of hydroxypropylmethyl cellulose, polyvinyl alcohol, polyvinyl formal and polyvinyl butyral; 0.1 to 10 weight percent polyfunctional, hydroxy-reactive C methylated melamine resin; and 0.1 to 5 weight percent palladium in a liquid comprising water, methanol, ethanol, propanol, butanol, propanol, ethylene glycol monoethyl ester, ethylene glycol monopropyl ester, ethylene glycol monobutyl ester, acetone, methylethyl ketone tetrahydrofuran or a mixture thereof.

* * * * *